United States Patent
Ueda et al.

(10) Patent No.: US 11,340,316 B2
(45) Date of Patent: May 24, 2022

(54) MAGNETIC SENSOR AND MAGNETIC ENCODER

(71) Applicant: TDK Corporation, Tokyo (JP)

(72) Inventors: Kunihiro Ueda, Tokyo (JP); Yoshiyuki Mizoguchi, Tokyo (JP); Hiroshi Yamazaki, Tokyo (JP); Suguru Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/916,606

(22) Filed: Jun. 30, 2020

(65) Prior Publication Data

US 2020/0348373 A1 Nov. 5, 2020

Related U.S. Application Data

(63) Continuation of application No. 16/049,993, filed on Jul. 31, 2018, now Pat. No. 10,739,419, which is a (Continued)

(30) Foreign Application Priority Data

Mar. 26, 2015 (JP) .............................. JP2015-064212

(51) Int. Cl.
*G01R 33/09* (2006.01)
*G01D 5/245* (2006.01)

(52) U.S. Cl.
CPC ........... *G01R 33/09* (2013.01); *G01R 33/093* (2013.01); *G01R 33/098* (2013.01); *G01D 5/2455* (2013.01)

(58) Field of Classification Search
CPC .... G01R 33/09; G01R 33/093; G01R 33/098; G01R 33/091; G01D 5/2455
See application file for complete search history.

(56) References Cited

U.S. PATENT DOCUMENTS

| 5,572,199 A | 11/1996 | Seki |
| 7,786,725 B2 * | 8/2010 | Furukawa ............ G01R 33/093 324/207.21 |

(Continued)

FOREIGN PATENT DOCUMENTS

JP 2001-264112 A 9/2001

OTHER PUBLICATIONS

Office Action dated May 2, 2018 in the corresponding Chinese Patent Application No. 201610108583.9 (and English translation).

*Primary Examiner* — Dominic E Hawkins
(74) *Attorney, Agent, or Firm* — Posz Law Group, PLC

(57) ABSTRACT

A magnetic sensor is provided with first and second magnetoresistive effect elements that can detect an external magnetic field. The first and second magnetoresistive effect elements are a plurality of layers of multilayer body including free layers where their magnetization directions vary due to the external magnetic field. Shapes of the first and second magnetoresistive effect elements viewed from the upper side in the lamination direction are different from each other. The first magnetoresistive effect element has a shape that can increase a slope of an output of the first magnetoresistive effect element relative to the change of the external magnetic field. The second magnetoresistive effect element has a shape that can decrease a slope of an output of the second magnetoresistive effect element relative to the change of the external magnetic field compared to the slope of the output of the first magnetoresistive effect element.

19 Claims, 7 Drawing Sheets

Related U.S. Application Data continuation of application No. 14/996,468, filed on Jan. 15, 2016, now Pat. No. 10,073,150.

(56) References Cited

U.S. PATENT DOCUMENTS

| | | |
|---|---|---|
| 10,073,150 B2 | 9/2018 | Ueda et al. |
| 2003/0123198 A1 | 7/2003 | Sugawara et al. |
| 2005/0088789 A1* | 4/2005 | Hou .................... G11B 5/3932 360/324.12 |
| 2009/0015252 A1* | 1/2009 | Raberg .................... H01L 27/22 324/252 |
| 2009/0130491 A1 | 5/2009 | Ohta et al. |
| 2010/0259257 A1 | 10/2010 | Sasaki et al. |
| 2011/0200845 A1 | 8/2011 | He et al. |
| 2012/0229935 A1 | 9/2012 | Song et al. |
| 2013/0094284 A1 | 4/2013 | Ohno et al. |
| 2013/0200886 A1 | 8/2013 | Kirste et al. |
| 2014/0021943 A1 | 1/2014 | Watanabe et al. |
| 2015/0023096 A1 | 1/2015 | Roiz Wilson |
| 2016/0202330 A1 | 7/2016 | Yamamoto et al. |

* cited by examiner

MAGNETIC SENSOR AND MAGNETIC ENCODER

Cross-Reference to Related Applications

This application is a continuation application of U.S. Utility application Ser. No. 16/049,993 filed on Jul. 31, 2018, which is a continuation of U.S. Utility application Ser. No. 14/996,468 filed on Jan. 15, 2016 (now U.S. Pat. No. 10,073,150), which is based on Japanese Patent Application No. 2015-064212 filed on Mar. 26, 2015, the contents of which are incorporated herein by reference.

TECHNICAL FIELD

The present application relates to a magnetic sensor, and a magnetic encoder provided with the magnetic sensor.

BACKGROUND

Conventionally, in machine tools or the like, a position detecting device for detecting a position created by the rotational movement or linear movement of a movable body is used. One type of known position detecting device is provided with a medium/media where magnetic signals are recorded and a magnetic sensor, and the magnetic sensor can output a signal indicating a relative positional relationship between a medium and the magnetic sensor.

One known magnetic sensor used in such a position detecting device is a multilayer body having a free layer and a magnetization pinned layer and provided with a magnetoresistive effect element (MR element) where resistance is changed in association with a magnetization direction of the free layer according to an external magnetic field. Further, known media used in such a position detecting device include, for example, one having a track for absolute signals, one having a track for incremental signals, one having a track for absolute signals and a track for incremental signals.

Conventionally, one magnetic sensor used for the position detecting device provided with the medium having a track for absolute signals and a track for incremental signals has two types of MR elements: an MR element for detecting a magnetic signal recorded in the track for absolute signals and an MR element for detecting a magnetic signal recorded in the track for incremental signals is proposed (see Patent Literature 1).

Patent Literature

Japanese Patent Application Laid-Open No. 2001-264112

In the magnetic sensor, the MR element for detecting a magnetic signal recorded in the track for absolute signals requires a characteristic (response characteristic) to exponentially change an output in response to the change of the magnetic field relative to the relative movement of the medium. In the meantime, the MR element for detecting a magnetic signal recorded in the track for incremental signals requires a characteristic (response characteristic) to linearly change the output in response to the change of the magnetic field relative to the relative movement of the medium.

Thus, in two types of MR elements with different response characteristics in demand, recently, improvement of the response characteristics, such as further higher sensitivity or lower noise, is in demand. Conventionally, the improvement of the response characteristics is attempted by use of materials configuring layers, such as the free layer configuring the MR elements, and by optimization, such as film thickness of the layers, and the like. However, there is the problem that it is very difficult to further improve the response characteristics by these attempts.

SUMMARY

Reflecting on the above problem, the objective of the present embodiment is to produce a magnetic sensor and a magnetic encoder that have two types of magnetoresistive effect elements requiring response characteristics different from each other, and that can improve different response characteristics required for the magnetoresistive effect elements.

In order to solve the problem, the present embodiment produces a magnetic sensor, provided with at least a first magnetoresistive effect element and a second magnetoresistive effect element that can detect an external magnetic field, wherein the first magnetoresistive effect element and the second magnetoresistive effect element are a plurality of layers of a multilayer body including at least a free layer where its magnetization direction varies according to the external magnetic field; when at least the free layer of the first magnetoresistive effect element and at least the free layer of the second magnetoresistive effect element are viewed from the upper side in the lamination direction, both the free layers have shapes that are different from each other; the shape of at least the free layer of the first magnetoresistive effect element viewed from the upper side in the lamination direction of the first magnetoresistive effect element is a shape that can increase the slope of output of the first magnetoresistive effect element relative to the change of the external magnetic field; and the shape of at least the free layer of the second magnetoresistive effect element viewed from the upper side in the lamination direction of the second magnetoresistive effect element is a shape that can decrease the slope of output of the second magnetoresistive effect element relative to the change of the external magnetic field compared to the slope of the output of the first magnetoresistive effect element.

According to the embodiment, the different response characteristics required for first and second magnetoresistive effect elements can both be improved by setting the shape of the first magnetoresistive effect element requiring that the slope of output be great (an output change is exponential) and that of the second magnetoresistive effect element requiring that the slope of output be smaller than that (an output change is linear) to have the appropriate responsive characteristics.

In the embodiment above, the shape of at least the free layer of the first magnetoresistive effect element can be a polygon with M+N sides (M is an integer of 3 or greater, and N is an integer of 1 or greater); and the shape of at least the free layer of the second magnetoresistive effect element can be a polygon with M sides; it is preferable that the shape of at least the free layer of the first magnetoresistive effect element be a polygon with M+N sides (M is an even number of 4 or greater, and N is an integer of 1 or greater); and the shape of at least the free layer of the second magnetoresistive effect element is a polygon with M sides; and it is preferable that the shape of at least the free layer of the second magnetoresistive effect element be a shape having at least two facing sides parallel to one another.

Also, in the embodiment above, the shape of at least the free layer of the first magnetoresistive effect element can be nearly circular, and the shape of at least the free layer of the second magnetoresistive effect element can be nearly square-shaped.

In the embodiments above, a TMR element or a GMR element can be used as the first magnetoresistive effect element and the second magnetoresistive effect element; and in the embodiments) above, it is preferable that the first magnetoresistive effect element and the second magnetoresistive effect element be formed by laminating a magnetization pinned layer, a non-magnetic intermediate layer and the free layer in this order. In the embodiment above, it is preferable that the non-magnetic intermediate layer be $MgO_X$ (X=0.1 to 0.9). In the embodiments above, it is preferable that the non-magnetic intermediate layer be a multilayer body at least including a first non-magnetic intermediate layer and a second non-magnetic intermediate layer.

Further, the present embodiment produces a magnetic encoder, that has the magnetic sensor according to the above embodiments; and a scale part that has an absolute signal track where absolute magnetic signals are recorded and an incremental signal track where incremental magnetic signals are recorded, and that is movable relative to the magnetic sensor, wherein the magnetic sensor and the scale part are placed to face each other so that the first magnetoresistive effect element and the absolute signal track face each other and the second magnetoresistive effect element and the incremental signal track face each other.

According to the present embodiment, a magnetic sensor and a magnetic encoder can be produced that each include two types of magnetoresistive effect elements requiring mutually different response characteristics, and can both improve the different response characteristics required for each magnetoresistive effect element.

DETAILED DESCRIPTION

Figure 1:
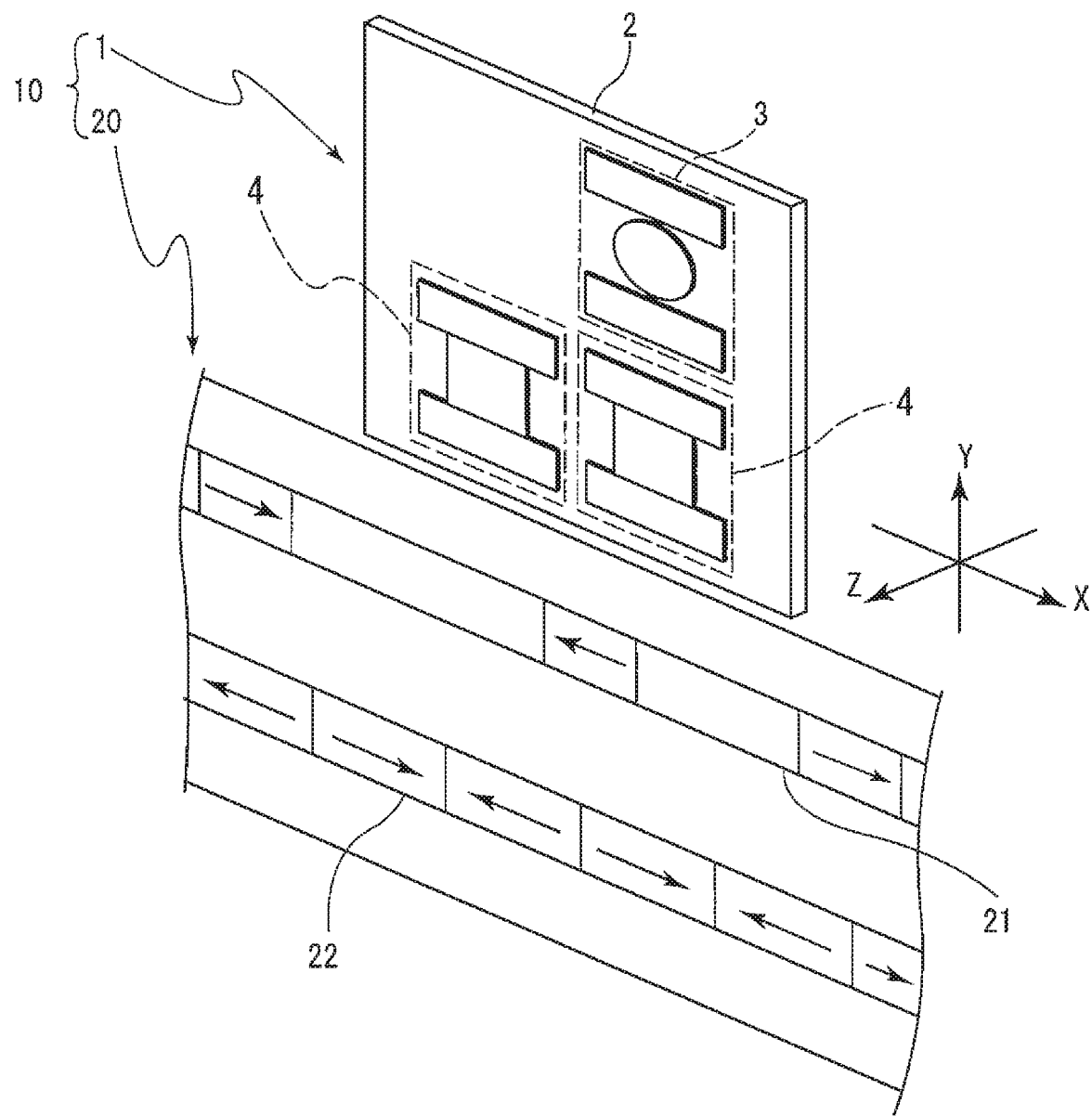
FIG. 1 is a perspective view showing a schematic configuration of a magnetic encoder provided with a magnetic sensor relating to one embodiment of the present embodiment.
Figure 2:
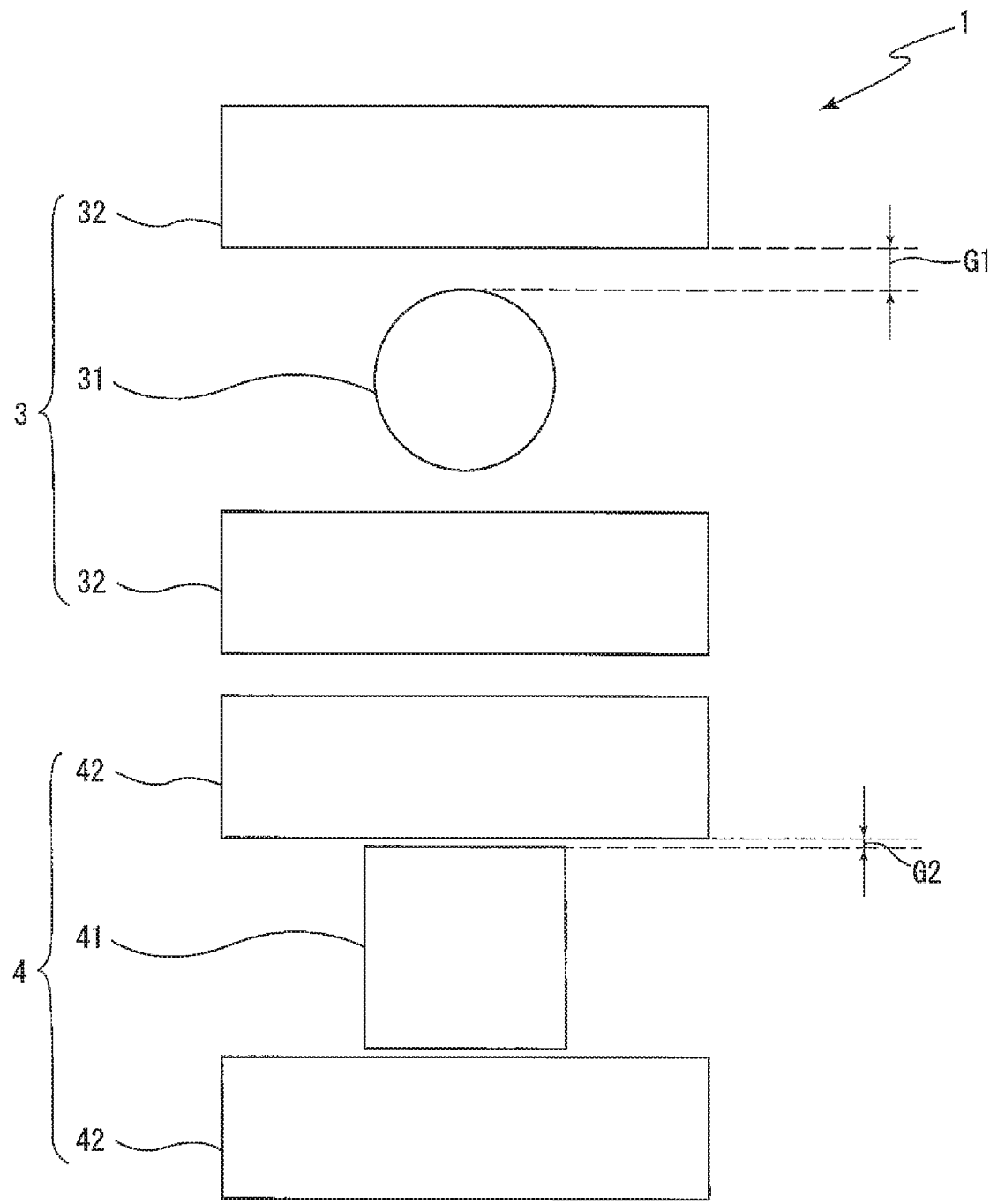
FIG. 2 is a plan view showing a schematic configuration of the magnetic sensor relating to one embodiment of the present embodiment.
Figure 3:
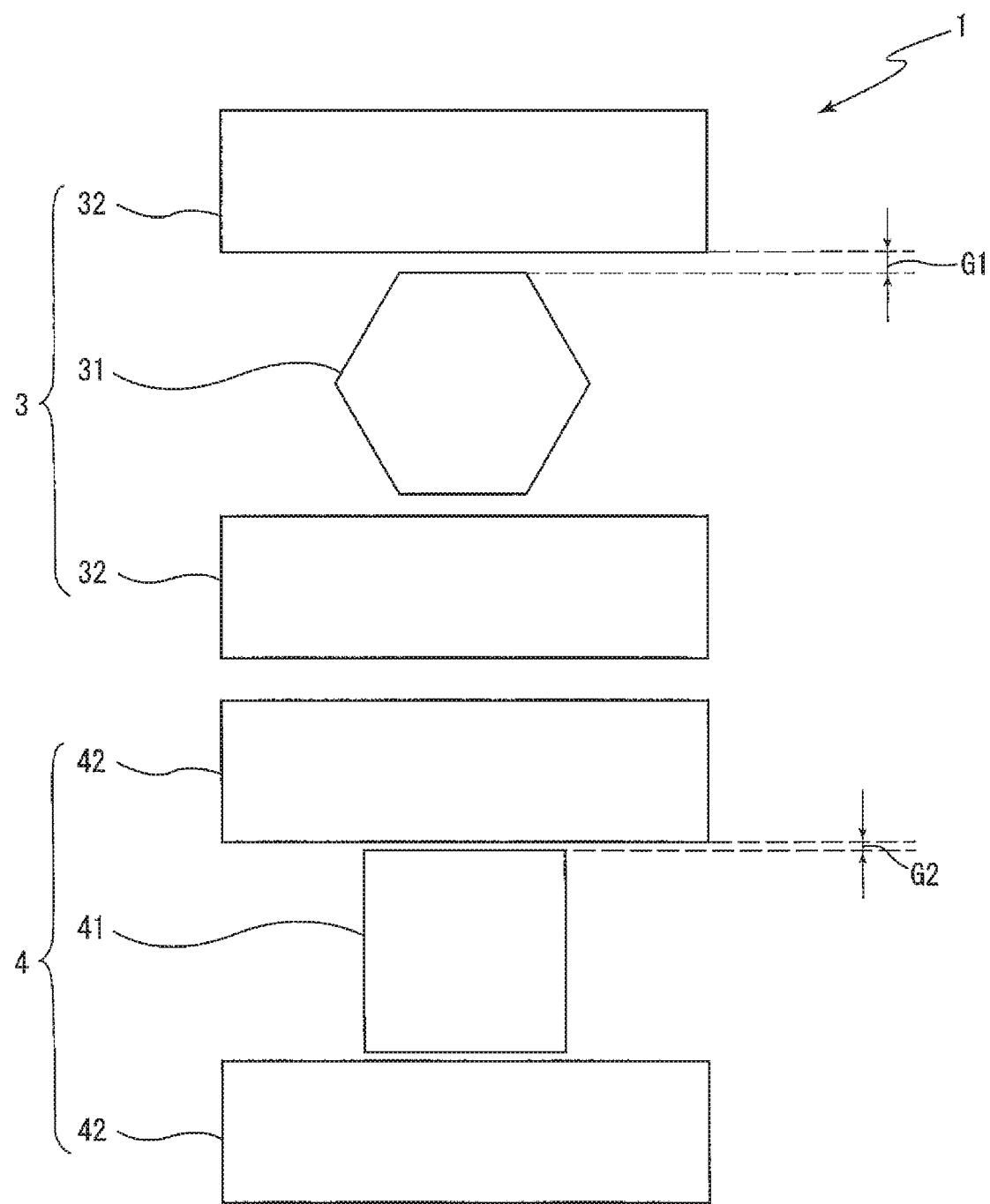
FIG. 3 is a plan view showing another schematic configuration of the magnetic sensor relating to one embodiment of the present embodiment.
Figure 4:
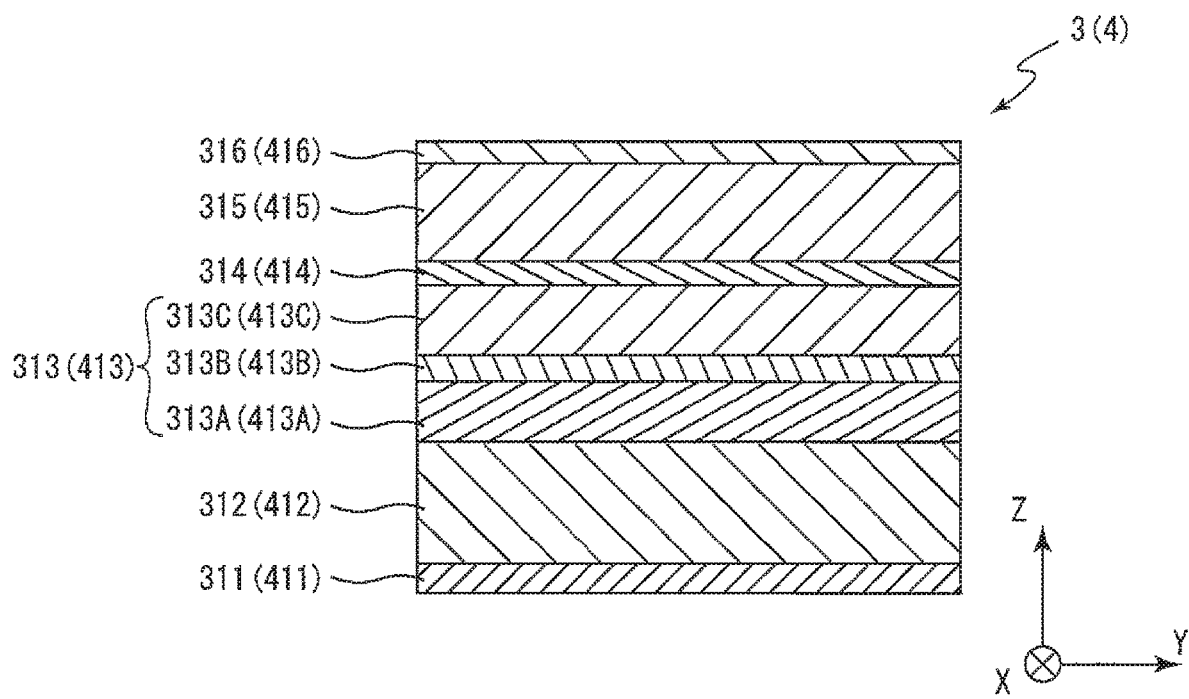
FIG. 4 is a cross-sectional view showing a schematic configuration of a first magnetoresistive effect element or a second magnetoresistive effect element in one embodiment of the present embodiment.

The embodiment of the present embodiment is explained in detail with reference to the drawings. FIG. 1 is a perspective view showing the schematic configuration of a magnetic encoder provided with a magnetic sensor relating to the present embodiment; FIG. 2 is a plan view showing the schematic configuration of the magnetic sensor relating to the present embodiment; FIG. 3 is a plan view showing another schematic configuration of the magnetic sensor relating to the present embodiment; and FIG. 4 is a cross-sectional view showing the schematic configuration of magnetoresistive effect elements in the present embodiment.

As shown in FIG. 1, a magnetic encoder 10 in the present embodiment is provided with a magnetic sensor 1 relating to the present embodiment and a scale part 20 that is relatively movable in a first direction (hereafter, it may be referred to as the "X direction") relative to the magnetic sensor 1.

In the present embodiment, the scale part 20 is a so-called linear scale, and has an absolute signal track 21, where absolute magnetic signals are recorded, and an incremental signal track 22, where incremental magnetic signals are recorded. The absolute magnetic signals and the incremental magnetic signals are magnetized in the first direction (±X direction). Furthermore, in FIG. 1, the magnetization directions of the absolute magnetic signals and the incremental magnetic signals are shown with arrows.

As shown in FIG. 2, the magnetic sensor 1 relating to the present embodiment is provided with a substrate 2, a first magnetic sensor part 3 and two second magnetic sensor parts 4, 4 placed on the substrate 2. The first magnetic sensor part 3 is a magnetic sensor for detecting an absolute magnetic signal recorded in the absolute signal track 21 of the scale part 20. The second magnetic sensor part 4 is a magnetic sensor for detecting an incremental magnetic signal recorded in the incremental signal track 22 of the scale part 20.

The first sensor part 3 is provided with a spin-valve type first magnetoresistive effect element (first MR element) 31, and bias magnetic field generators 32 placed at both sides in a second direction (hereafter, it may be referred to as the Y direction) of the first MR element 31 so as to interpose the first MR element 31. The two second magnetic sensor parts 4 and 4 are provided with a spin-valve type second magnetoresistive effect element (second MR element) 41, and bias magnetic field generators 42 that are placed at both sides in the Y direction of the second MR element 41 so as to interpose the second MR element 41.

The substrate 2 is a rectangle that supports both the first magnetic sensor part 3 and the second magnetic sensor part 4, and for example, can be made from glass, silicon (Si), aluminum oxide ($Al_2O_3$), AlTic ($Al_2O_3$—TiC) or the like.

In the present embodiment, the first MR element 31 that detects an absolute magnetic signal recorded in the absolute signal track 21 has response characteristics that can exponentially change an output according to changes of the external magnetic field by the relative movement of the track 21 (scale part 20). In the meantime, the second MR element 41 that detects an incremental magnetic signal recorded in the incremental signal track 22 has response characteristics that can linearly change the output according to changes of the external magnetic field due to the relative movement of the track 22 (scale part 20). In other words, a slope of the output by the first MR element 31 becomes greater than that of the output by the second MR element 41. For example, if the external magnetic field is changed within the range of −50 Oe to 50 Oe, the slope of the output by the first MR element 31 is approximately 10 mV/Oe or greater. In the meantime, the slope of the output by the second MR element 41 is approximately 2 to 5 mV/Oe. The first MR element 31 and the second MR element 41 can effectively demonstrate response characteristics that are different from each other by adjusting the shapes viewed from the upper side in the lamination direction (Z direction) to a shape that can exponentially change the output and a shape that can linearly change the output.

Specifically, as shown in FIG. 2, if the shape of the first MR element 31 viewed from the upper side in the lamination direction is nearly circular and the shape of the second MR element 41 viewed from the upper side in the lamination direction is nearly square-shaped, the first MR element 31 and the second MR element 41 can effectively demonstrate the demanded response characteristics. Furthermore, in the present embodiment, other than a perfect circle, a "near circle" includes a circle where its shorter diameter is 70% or greater than its longer diameter. Further, other than a square or rectangle, a "nearly square shape" includes a quadrangle where its four internal angles are all 85 degrees to 95 degrees.

Further, as shown in FIG. 3, if the shapes of the first MR element 31 and the second MR element 41 viewed from the upper side in the lamination direction are both polygonal-shaped and the number of angles in the first MR element 31 is more than that of the second MR element 41 (in the example shown in FIG. 3, the shape of the first MR element 31 is hexagonally-shaped, and the shape of the second MR element 41 is rectangular-shaped), the first MR element 31 and the second MR element 41 can effectively demonstrate response characteristics that are different from each other. In other words, the shape of the first MR element 31 can be a polygon with M+N sides and the shape of the second MR element 41 can be a polygon with M sides (M is preferably an integer of 3 or greater, and M is particularly preferably an integer of 5 or greater; N is preferably an integer of 1 or greater). With this design, the first MR element 31 and the second MR element 41 can effectively demonstrate response characteristics that are different from each other.

Preferably, the shape of the second MR element 41 is a polygon with M sides (where M is an even number of 4 or greater), and is more preferably a regular polygon with regular M sides (where M is an even number of 4 or greater). As described later, a bias magnetic field generator 42 is placed closer to the second MR element 41, compared to the first MR element 31. Consequently, because the shape of the second MR element 41 is a polygon with M sides (where M is an even number of 4 or greater), and is particularly a regular polygon with M sides (where M is an even number of 4 or greater), two opposite sides of the second MR element 41 viewed from the upper side of the lamination direction of the second MR element 41, and specifically two opposite parallel sides of the second MR element 41, especially when the shape of the second MR element 41 is a regular polygon with M sides (where M is an even number of 4 or greater), can face the bias magnetic field generator 42. As a result, the distance G2 between the second MR element 41 and the bias magnetic field generator 42 can be diminished, and it is easy to nearly uniformly apply a bias magnetic field by the bias magnetic field generator 42 to the entire second MR element 41; therefore, it is preferable that M be 4 or a greater even number from the viewpoint of manufacturing.

The bias magnetic field generators 32 and 42 are, for example, made from a permanent magnet, and the bias magnetic field is applied to free layers 315 and 415 so as to allow an initial magnetization direction (magnetizations 315M and 415M of the entire free layers 315 and 415 when an external magnetic field is zero (zero magnetic field) of the free layers 315 and 415 (see FIG. 4) to be oriented toward a predetermined direction (the Y direction in the present embodiment).

The distance G1 between the first MR element 31 and the bias magnetic field generator 32 is preferably greater than the distance G2 between the second MR element 41 and the bias magnetic field generator 42, and the distance G1 and the distance G2 can be appropriately set within the range of 0 to 5 μm. Because the distance G1 is greater than the distance G2, the intensity of the bias magnetic field to be applied to the first MR element 31 is smaller than that of the bias magnetic field to be applied to the second MR element 41; thus, the change of the output from the first MR element 31 can be more exponential; in the meantime, the change of the output from the second MR element 41 can be more linear. Furthermore, the distance G1 between the first MR element 31 and the bias magnetic field generator 32 means the shortest space in the Y direction between the first MR element 31 and the bias magnetic field generator 32 in a planar view (when viewed from the upper side in the lamination direction of the first MR element 31). The distance G2 between the second MR element 32 and the bias magnetic field generator 42 similarly means the shortest space in the Y direction between the second MR element 41 and the bias magnetic field generator 42.

Next, a lamination structure of the first MR element 31 and the second MR element 41 is explained. As shown in FIG. 4, the first MR element 31 and the second MR element 41 are multilayer bodies where under layers 311 and 411, antiferromagnetic layers 312 and 412, magnetization pinned layers 313 and 413, nonmagnetic intermediate layers 314 and 414, free layers 315 and 415 and cap layers 316 and 416 are laminated in that order. A lower side electrode layer and an upper side electrode layer (neither are illustrated) made from a Cu film or the like are placed under the under layers 311 and 411 (at the substrate 2 side) and over the cap layers 316 and 416 and a sense current flows along the lamination direction of the first MR element 31 and the second MR element 41.

The under layers 311 and 411 are formed for eliminating the effect of a crystal axis of the substrate 2, and for improving the crystallizability and the orientation of each layer to be laminated over the under layers 311 and 411. Ta, Ru and the like are exemplary as materials to configure the under layers 311 and 411.

The antiferromagnetic layers 312 and 412 are layers that play the role of pinning the magnetization direction of the magnetization pinned layers 313 and 413 over those layers. An antiferromagnetic material containing, for example, at least one type of element to be selected from the group Pt, Ru, Rh, Pd, Ni, Cu, Ir, Cr and Fe, and, Mn can be used as a material to configure the antiferromagnetic layers 312 and 412. The content of Mn in this antiferromagnetic material is preferably the atomic % of 35 to 95.

A non-heat treatment type antiferromagnetic material that indicates antiferromagnetic properties without requiring any heat treatment, and that induces an exchange-coupling magnetic field with a ferromagnetic material, and a heat treatment type antiferromagnetic material that indicates antiferromagnetic properties by heat treatment are available as antiferromagnetic materials. In the present embodiment, either type of antiferromagnetic material is usable as the material configuring the antiferromagnetic layers 312 and 412. Also, RuRhMn, FeMn, IrMn and the like are exemplary non-heat treatment type antiferromagnetic materials, and PtMn, NiMn, PtRhMn and the like are exemplary heat treatment type antiferromagnetic materials.

The magnetization pinned layers 313 and 413 have a configuration where first magnetization pinned layers 313A and 413A, intermediate layers 313B and 413B and second magnetization pinned layers 313C and 413C are laminated on the antiferromagnetic layers 312 and 412 in that order. The first magnetization pinned layers 313A and 413A and the second magnetization pinned layers 313C and 413C can be configured from exemplary materials NiFe, CoZrTa, sendust, NiFeCo, CoZrNb, CoFe, CoFeB and the like, and Ru and the like are exemplary as the material constituting the intermediate layers 313B and 413B. The thickness of the magnetization pinned layers 313 and 413 can be approximately 3.5 nm to 5.5 nm.

In the magnetization pinned layers 313 and 413, the magnetization of the first magnetization pinned layers 313A and 413A is solidly pinned by the antiferromagnetic layers 312 and 412, and the magnetization of the second magnetization pinned layers 313C and 413C is exchange-coupled with the first magnetization pinned layers 313A and 413A via the intermediate layers 313B and 413B and is solidly pinned. In the present embodiment, the magnetization direction of the second magnetization pinned layers 313C and 413C is set to the X direction.

The free layers 315 and 415 are soft magnetic layers where the magnetization direction is changed according to the change of signal magnetic fields of the absolute magnetic signal and the incremental magnetic signal relative to the relative movement of the scale part 20. The free layers 315 and 415 can be configured from exemplary materials such as NiFe, CoFe, CoFeB, CoFeNi, $Co_2MnSi$, $Co_2MnGe$, FeOx (oxide of Fe) and the like. The thickness of the free layers 315 and 415 can be adjusted at approximately 0.5 nm to 8 nm. The initial magnetization direction in the free layers 315 and 415 is set to the Y direction due to application of the bias magnetic field from the bias magnetic field generators 32 and 42.

The non-magnetic intermediate layers 314 and 414 are essential films for creating a magnetoresistive effect (MR effect) in the first MR element 31 and the second MR element 41 in the present embodiment. When the first MR element 31 and the second MR element 41 in the present embodiment are TMR elements that demonstrate a tunnel magnetoresistive effect, the non-magnetic intermediate layers 313 and 414 are made from an insulating layer. In the meantime, when the first MR element 31 and the second MR element 41 in the present embodiment are GMR elements, the non-magnetic intermediate layers are made from metal layers. The non-magnetic intermediate layers 314 and 414 can be configured using exemplary materials such as Cu, Au, Ag, Zn, Ga, TiOx, ZnO, InO, SnO, GaN, indium tin oxide (ITO), $Al_2O_3$, MgO and the like. When the first MR element 31 and the second MR element 41 are TMR elements in the present embodiment, it is preferable to use $MgO_X$ (X=0.1 to 0.9) as a material configuring the non-magnetic intermediate layers 314 and 414. A higher MR ratio can be obtained by using $MgO_X$ (X=0.1 to 0.9) as a material configuring the non-magnetic intermediate layers 314 and 414.

The non-magnetic intermediate layers 314 and 414 can be made from preferably two layers or more of lamination films. Resistance of the MR elements can be easily adjusted if the non-magnetic intermediate layers 314 and 414 are made from two layers or more of lamination films. For example, the non-magnetic intermediate layers 314 and 414 can be made from a two-layer lamination film of MgO/MgO or three-layer lamination film of Cu/ZnO/Cu or Cu/ZnO/Zn. Furthermore, thickness of the non-magnetic intermediate layers 314 and 414 can be adjusted to approximately 0.5 nm to 5 nm.

The cap layers 316 and 416 are layers for protecting the first MR element 31 and the second MR element 41. For the cap layers 316 and 416, one type of single layer film, or two types or more lamination film can be configured from exemplary materials such as Ta, Ru, Cu, Ag, Rh, Cr, Tl, Re, Ir, Mo, W, Ti and the like.

Figure 5:
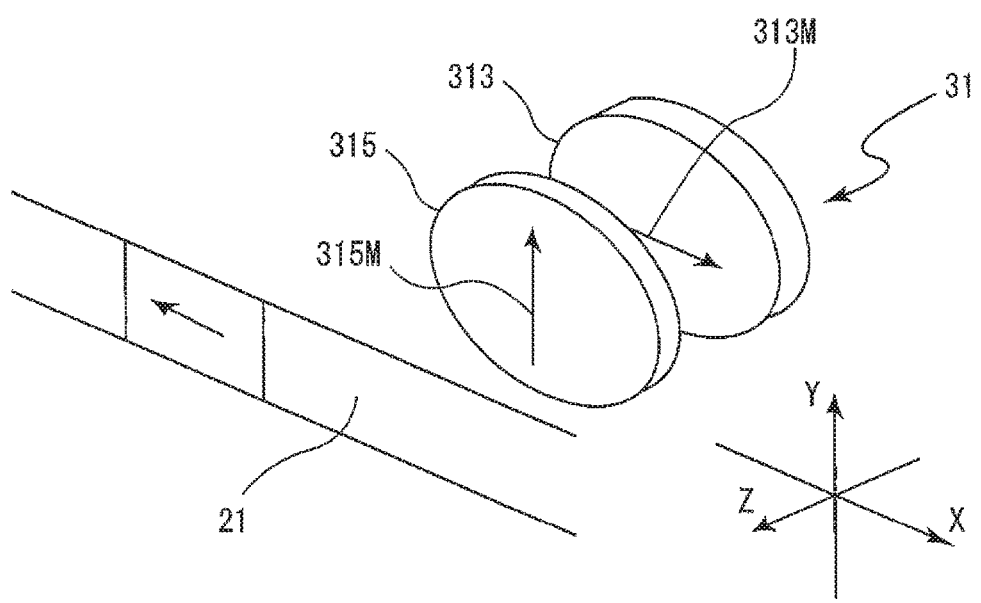
FIG. 5 is a perspective view for explaining operation of the first magnetoresistive effect element in one embodiment of the present embodiment.
Figure 6:
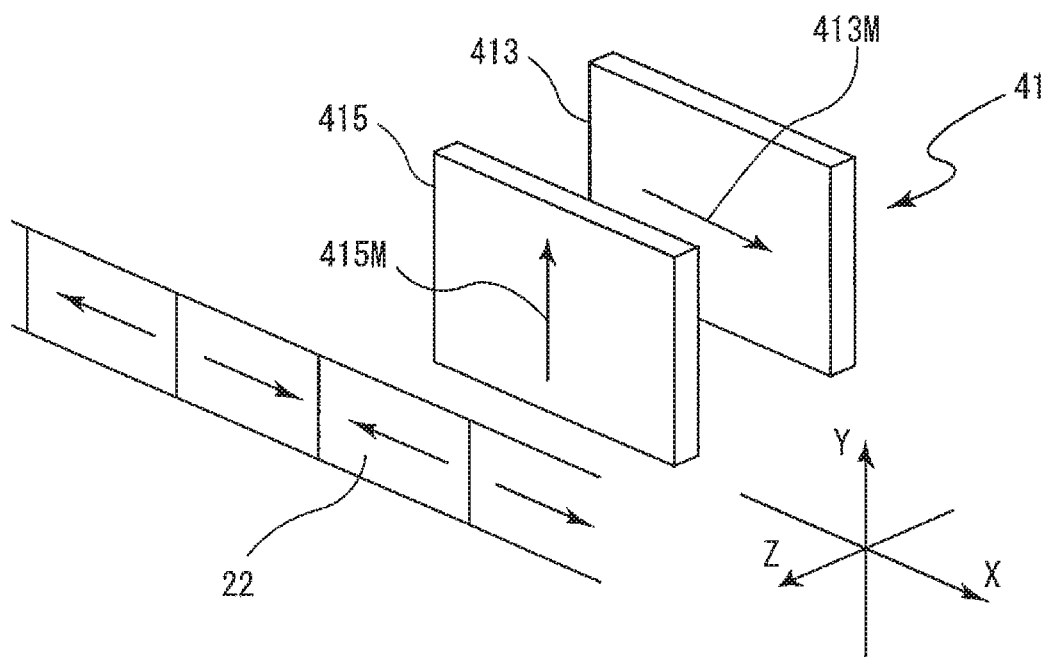
FIG. 6 is a perspective view for explaining operation of the second magnetoresistive effect element in one embodiment of the present embodiment.

Operation of the magnetic encoder 10 in the present embodiment having the configuration above is explained. In the first MR element 31, magnetizations 315M and 313M of the free layer 315 and the magnetization pinned layer 313 are substantially orthogonal to each other (see FIG. 5). This situation is the initial state as the first MR element 31. Similarly in the second MR element 41, magnetizations 415M and 413M of the free layer 415 and the magnetization pinned layer 413 are substantially orthogonal to each other (see FIG. 6).

Figure 7:
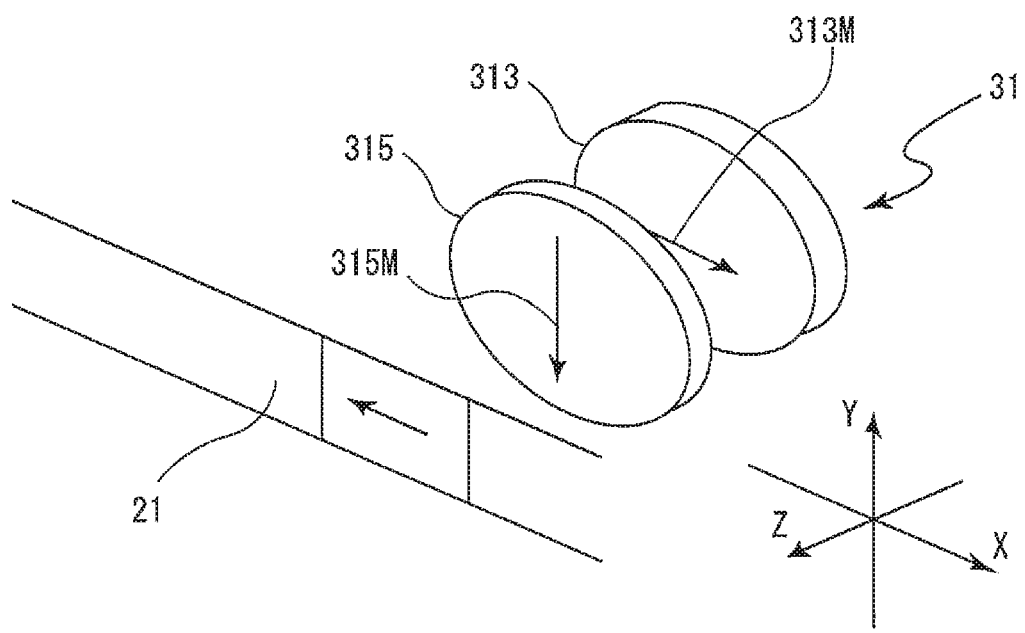
FIG. 7 is a perspective view for explaining operation of the first magnetoresistive effect element in one embodiment of the present embodiment.
Figure 9:
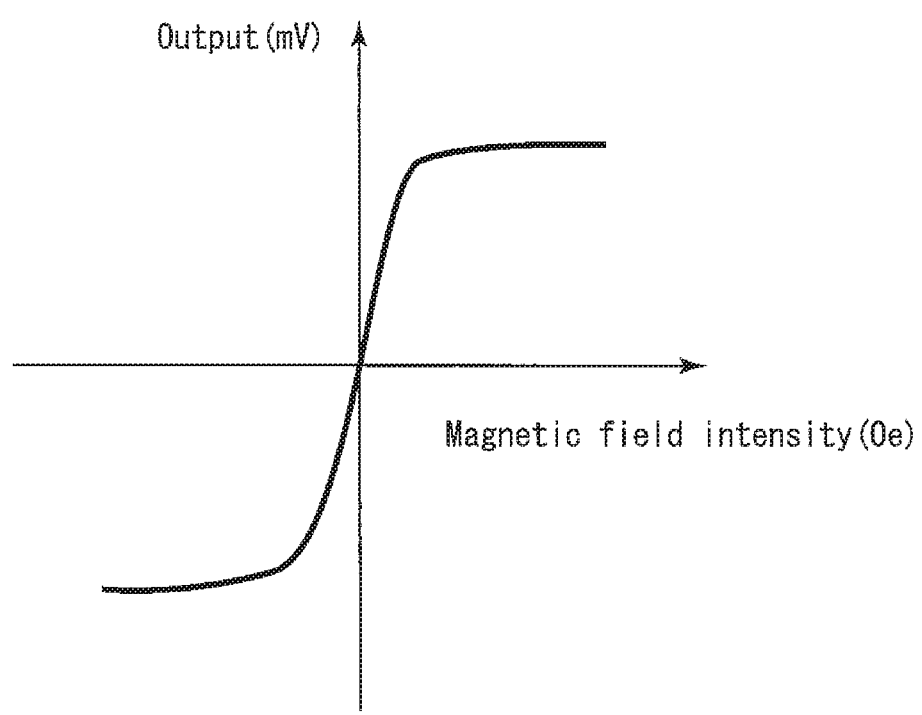
FIG. 9 is a graph showing an output change of the first magnetoresistive effect element in one embodiment of the present embodiment.

When the magnetic sensor 1 relating to the present embodiment relatively moves in the –X direction relative to the scale part 20, the magnetic field intensity of the external magnetic field that functions to the free layer 315 of the first MR element 31 due to an absolute magnetic signal in the absolute magnetic signal track 21 is gradually changed. For example, the magnetic sensor 1 and the scale part 20 move relatively with each other, and as a physical distance between the first MR element 31 and the absolute magnetic signal of the absolute magnetic signal track 21 becomes smaller, the magnetic field intensity of the external magnetic field that functions to the free layer 315 of the first MR element become gradually greater. Because the free layer 315 of the first MR element 31 in the present embodiment has a shape that can exponentially change the output relative to the change in the external magnetic field, i.e., the shape that can exponentially rotate the magnetization, when the magnetic field intensity of the external magnetic field to the free layer 315 exceeds a predetermined threshold value, the magnetization 315M of the free layer 315 substantially rotates by 90 degrees (see FIG. 7). In other words, when the resistance value in the first magnetic sensor 3 (first MR element 31) is exponentially increased (or decreased), the output by the first MR element 31 is exponentially changed (see FIG. 9). This enables detection of an absolution position with high accuracy.

In the magnetic encoder 10 in the present embodiment, the shape viewed from the upper side in the lamination direction of the first MR element 31 is, for example, nearly circular; thus the output by the first MR element 31 can be exponentially changed.

Figure 8:
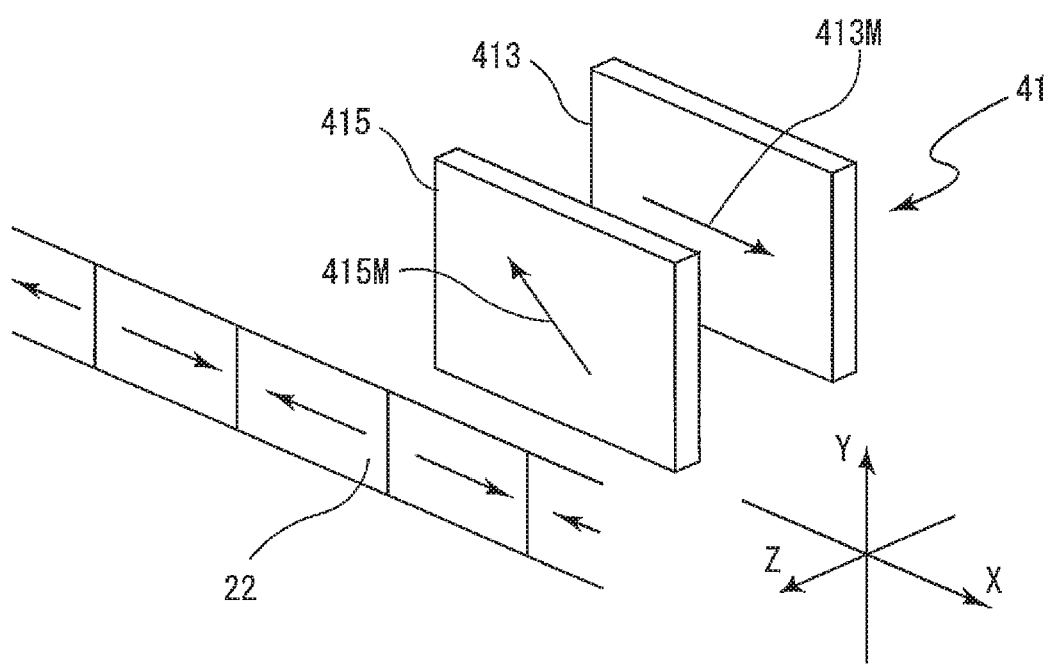
FIG. 8 is a perspective view for explaining operation of the second magnetoresistive effect element in one embodiment of the present embodiment.
Figure 10:
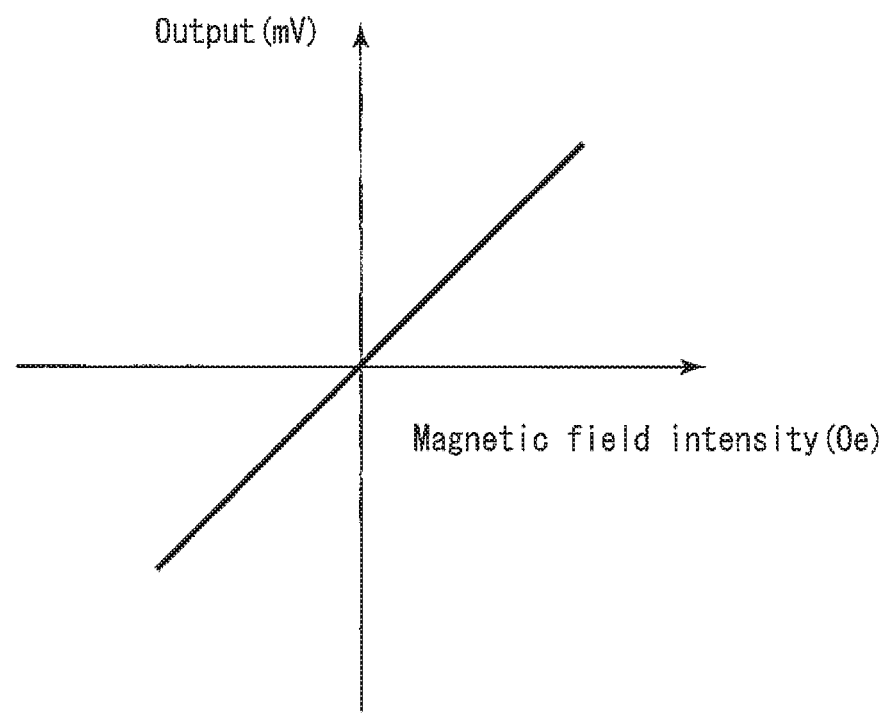
FIG. 10 is a graph showing an output change of the second magnetoresistive effect element in one embodiment of the present embodiment.

In the meantime, when the magnetic sensor 1 relating to the present embodiment relatively moves in the –X direction relative to the scale part 20, the magnetic field intensity of the external magnetic field, due to the incremental magnetic signal of the incremental magnetic signal track 22, to the free layer 415 of the second MR element 41, gradually changes. Because the free layer 415 of the second MR element 41 in the present embodiment has a shape that can linearly change the output relative to the change of the external magnetic field, i.e., the shape that can substantially rotate the magnetization at a constant speed, the magnetization 415M of the free layer 415 gradually rotates in accordance with the change of the magnetic field intensity of the external magnetic field to the free layer 415 (see FIG. 8). In other words, the resistance value in the second magnetic sensor 4 (second MR element 41) is gradually increased or decreased, and the output by the second MR element 41 is linearly changed (see FIG. 10). This enables detection of an incremental position with high accuracy.

In the magnetic encoder 10 in the present embodiment, because the shape viewed from the upper side in the lamination direction of the second MR element 41 is, for example, nearly square-shaped, the output by the second MR element 41 can be linearly changed.

Thus, according to the magnetic sensor 1 relating to the present embodiment, because the first MR element 31 for detecting an absolute magnetic signal and the second MR element 41 for detecting an incremental magnetic signal have a desired shape (shape viewed from the upper side in the lamination direction) the demanded response characteristics (exponential change of output, linear change of output) can be effectively demonstrated. This enables the detection of an absolute position according to the absolute magnetic signal and an incremental position according the incremental magnetic signal with higher accuracy than conventional sensors.

The embodiment explained above is described for facilitating an understanding of the present embodiment, and is not described to restrict the present embodiment. Therefore, each element disclosed in the above embodiment has the intention of including all design changes and equivalents belonging to the technical scope of the present embodiment.

In the above embodiment, although the shapes of the first MR element 31 and the second MR element 41 (shapes viewed from upper side in the lamination direction) are shapes according to the required characteristics (for example, the first MR element 31 is nearly circular, and the second MR element 41 is nearly square-shaped), the present embodiment is not limited to such modes. For example, at least the free layers 315 and 415 have such shapes as mentioned above, and there is no restriction to the shape of each layer (such as the magnetization pinned layers 313 and 414).

Figure 11:
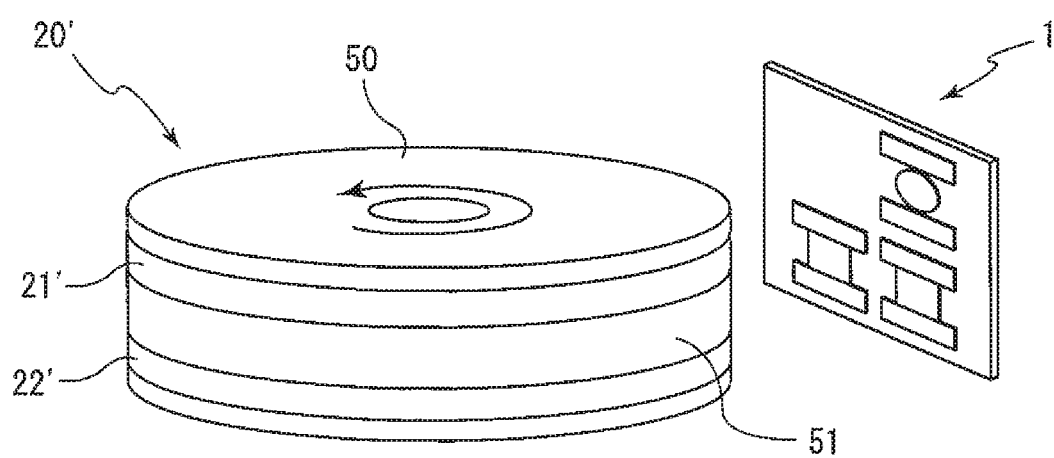
FIG. 11 is a perspective view showing another schematic configuration of the magnetic encoder provided with the magnetic sensor relating to one embodiment of the present embodiment.

In the above embodiment, a linear sensor having the magnetic signal tracks (the absolute magnetic signal track 21 and the incremental magnetic signal track 22) facing the magnetic sensor 1 was exemplified as the magnetic encoder 10 and explained, but the present embodiment is not restricted by such a mode. The magnetic encoder of the present embodiment may be a rotation angle sensor. In this case, as shown in FIG. 11, the configuration should be the one provided with the a scale part 20' where an absolute magnetic signal track 21' and an incremental magnetic signal track 22' are placed on an outer circumference surface 51 of a drum-state rotating body 50, and the magnetic sensor 1 relating to the present embodiment.

In the above embodiment, the magnetic sensor 1 is provided with both the first MR element 31 and the second MR element 41, but the present embodiment is not limited to such a mode. For example, the first magnetic sensor part 3 and the second magnetic sensor part 4 may include a plurality of first MR elements 31 and second MR elements 41.

EXEMPLARY EMBODIMENTS

The present embodiment is described in further detail hereafter, with reference to examples and the like, but the present embodiment is not limited to the examples below and the like at all.

Embodiment 1

The first MR element 31 and the second MR element 41 where the shapes viewed from the upper side in the lamination direction am circular and square-shaped, and that have the layer configuration shown in FIG. 4, were produced on the Si substrate 2, and, the magnetic sensor 1 where permanent magnets as the bias magnetic field generators 32 and 42 were placed was manufactured. The diameter of the first MR element 31 was set to 1.6 μm, the distance G1 between the first MR element 31 and the bias magnetic field generator 32 was set to 0.4 μm, the length of one side of the second MR element 41 was set to 2.8 μm and the distance G2 between the second MR element 41 and the bias magnetic field generator 42 was set to 0 μm. Then, while a constant current at 1 V of voltage was applied to the first MR element 31 and the second MR element 41, the intensity of the external magnetic field varied within the range of −10 Oe to 10 Oe, the external magnetic field was applied to the first MR element 31 and the second MR element 41, and the sensitivity (mV/Oe) of the first MR element 31 and the second MR element 41 was obtained. The results are shown in Table 2.

Furthermore, the materials and the film thickness configuring each layer of the first MR element 31 and the second MR element 41 are as shown in Table 1.

TABLE 1

|  | Material | Film thickness (Å) |
| --- | --- | --- |
| Cap layer (316, 416) | Ta/Ru | 60/70 |
| Free layer (315, 415) | NiFe | 40 |
| Non-magnetic intermediate layer (314, 414) | $MgO_x$ (X = 0.8) | 20 |
| Second magnetization pinned layer (313C, 413C) | CoFe/CoFeB | 10/10 |
| Intermediate layer (313B, 413B) | Ru | 8 |
| First magnetization pinned layer (313A, 413A) | CoFe/CoFeB | 20 |
| Antiferromagnetic layer (312, 412) | IrMn | 100 |
| Under layer (311, 411) | Ta/Ru | 20/20 |

Comparative Example 1

The first MR element 31 and the second MR element 41 were produced in a manner similar to Example 1, except that the shape of the second MR element 41 (shape viewed from the upper side in the lamination direction) was set to circular, and, equalizing its diameter and the distance G2 between the second MR element 41 and the bias magnetic field generator 42 to the diameter of the first MR element 31 and the distance G1 and the sensitivity of each MR element (mV/Oe) was obtained. The results are shown in Table 2.

Comparative Example 21

The first MR element 31 and the second MR element 41 were produced similarly to Example 1, except the shape of the first MR element 31 (shape viewed from the upper side in the lamination direction) was set to square-shaped, and equalizing the length of the one side and the distance G1 between the first MR element 31 and the bias magnetic field generator 32 to the diameter of the second MR element 41 and the distance G2. Also, the second MR element 41 (shape viewed from the upper side in the lamination direction) was set to a circular, and the diameter and the distance G2 between the second MR element 41 and the bias magnetic field generator 42 were equalized to the diameter of the first MR element 31 and the distance G1, and the sensitivity of each MR element (mV/Oe) was obtained. The results are shown in Table 2.

Comparative Example 31

The first MR element 31 and the second MR element 41 were produced in a manner similar to Example 1, except the shape of the first MR element 31 (shape viewed from the upper side in the lamination direction) was set to square-shaped, and the length of one side and the distance G1 between the first MR element 31 and the bias magnetic field generator 32 were equalized to the diameter of the second MR element 41 and the distance G2 and the sensitivity of each MR element (mV/Oe) was obtained. The results are shown in Table 2.

TABLE 2

| | Sensitivity (mV/Oe) | |
|---|---|---|
| | First MR element | Second MR element |
| Embodiment 1 | 15.0 | 2.7 |
| Comparative Example 1 | 15.0 | 15.0 |
| Comparative Example 2 | 2.7 | 15.0 |
| Comparative Example 3 | 2.7 | 2.7 |

According to the results shown in Table 2, because the shape of the first MR element 31 (shape viewed from the upper side in the lamination direction) was set to circular and the shape of the second MR element 41 (shape viewed from the upper side in the lamination direction) was set to square-shaped, it was confirmed that a slope of the output (mV/Oe) of the first MR element 31 can be greater than that of the output (mV/Oe) from the second MR element 41, the output by the first MR element 31 can be exponentially changed, and the output by the second MR element 41 can be linearly changed.

Subsequently, the external magnetic field was varied within the range of −50 Oe to 50 Oe using the magnetic sensor 1 of Embodiment 1 (the first MR element 31 was circular and the second MR element 41 was square-shaped) and the magnetic sensor of Comparative Example 1 (both the first MR element and the second MR element were circular), and change volume of the outputs of the second MR element (difference between a maximum output and a minimum output, mV) was obtained. Then, an index IL relating to the linearity using the expression below was calculated from output change volume MP1 (mV) of the second MR element when changing the external magnetic field within the range of −10 Oe to 10 Oe and output change volume MP2 (mV) of the second MR element when changing the external magnetic field within the range of −50 Oe to 50 Oe. The results are shown in Table 3.

$IL=MP2/MP1$

TABLE 3

| | | Linearity |
|---|---|---|
| Embodiment 1 | Second MR element (square) | 5 |
| Comparative Example 1 | Second MR element (circle) | 4.5 |

When the intensity of the external magnetic field was changed within the range of −50 Oe to 50 Oe, the index IL, the linearity indicated with a ratio of the output change volumes MP2 to MP1 at the time of changing within the range of −10 Oe to 10 Oe was closer to "5, which means that the output of the second MR element was changed linearly when the external magnetic field was changed within the range of −50 Oe to 50 Oe.

According to the results shown in Table 3, it is clear that the linearity would improve because the shape of the second MR element 41 (shape viewed from the upper side in the lamination direction) was square. According to this, it was confirmed that the output from the second MR element can be linearly changed by setting the shape of the second MR element (shape viewed from the upper side in the lamination direction) to square-shaped.

According to the results shown in Table 2 and Table 3, even if the shapes of the first MR element 31 and the second MR element 41 (shapes viewed from the upper side in the lamination direction) are polygonal-shaped, it is presumed that the output of the first MR element 31 is exponentially changed and the output of the second MR element 41 is linearly changed by approximating the shape of the first MR element 31 for detecting an absolute magnetic signal to more circular than the shape of the second MR element 41 for detecting an incremental magnetic signal.

In other words, according to the above results, it is presumed that the response characteristics required for the first MR element 31 and the second MR element 41 can be effectively demonstrated by setting the shape of the first MR element 31 (shape viewed from the upper side in the lamination direction) to a polygon with M+N sides (M is 3 or greater integer, and N is one or greater integer), and setting the shape of the second MR element 41 (shape viewed from the upper side in the lamination direction) to a polygon with M sides.

What is claimed is:
1. A magnetic sensor, comprising at least a first magnetoresistive effect element and a second magnetoresistive effect element that can detect an external magnetic field, wherein
each of the first magnetoresistive effect element and the second magnetoresistive effect element includes at least a magnetic layer having a magnetization direction that varies according to the external magnetic field;
the first magnetoresistive effect element has a first response characteristic;
the second magnetoresistive effect element has a second response characteristic;
the first response characteristic is a characteristic relative to a change of an output from the first magnetoresistive effect element with the change of the external magnetic field;

the second response characteristic is a characteristic relative to a change of an output from the second magnetoresistive effect element with the change of the external magnetic field; and the first response characteristic and the second response characteristic are different from each other;

when at least the magnetic layer of the first magnetoresistive effect element and at least the magnetic layer of the second magnetoresistive effect element are viewed from an upper side in a lamination direction, both the magnetic layers have shapes that are different from each other;

the shape of at least the magnetic layer of the first magnetoresistive effect element viewed from the upper side in the lamination direction of the first magnetoresistive effect element is a shape that can demonstrate the first response characteristic; and the shape of at least the magnetic layer of the second magnetoresistive effect element viewed from the upper side in the lamination direction of the second magnetoresistive effect element is a shape that can demonstrate the second response characteristic.

2. The magnetic sensor according to claim 1, wherein
the first response characteristic is a characteristic that can increase the slope of the output from the first magnetoresistive effect element with the change of the external magnetic field; and
the second response characteristic is a characteristic that can decrease the slope of the output from the second magnetoresistive effect element with the change of the external magnetic field compared to the slope of the output from the first magnetoresistive effect element.

3. The magnetic sensor according to claim 1, wherein
the shape of at least the magnetic layer of the first magnetoresistive effect element viewed from the upper side in the lamination direction of the first magnetoresistive effect element is a shape that can increase the slope of the output from the first magnetoresistive effect element with the change of the external magnetic field; and
the shape of at least the magnetic layer of the second magnetoresistive effect element viewed from the upper side in the lamination direction of the second magnetoresistive effect element is a shape that can decrease the slope of the output from the second magnetoresistive effect element with the change of the external magnetic field compared to the slope of the output from the first magnetoresistive effect element.

4. The magnetic sensor according to claim 1, wherein
the shape of at least the magnetic layer of the first magnetoresistive effect element is a polygon with M+N sides (M is 3 or greater integer, and N is 1 or greater integer); and
the shape of at least the magnetic layer of the second magnetoresistive effect element is a polygon with M sides.

5. The magnetic sensor according to claim 1, wherein
the shape of at least the magnetic layer of the first magnetoresistive effect element is a polygon with M+N sides (M is 4 or greater even number, and N is 1 or greater integer); and
the shape of at least the magnetic layer of the second magnetoresistive effect element is a polygon with M sides.

6. The magnetic sensor according to claim 1, wherein the shape of at least the magnetic layer of the second magnetoresistive effect element is a shape having at least two facing sides in parallel with each other.

7. The magnetic sensor according to claim 1, wherein
the shape of at least the magnetic layer of the first magnetoresistive effect element is nearly circular, and
the shape of at least the magnetic layer of the second magnetoresistive effect element is nearly square-shaped.

8. The magnetic sensor according to claim 1, wherein
each of the first magnetoresistive effect element and the second magnetoresistive effect element is a plurality of layers of a multilayer body including at least the magnetic layer.

9. The magnetic sensor according to claim 1, wherein
the first magnetoresistive effect element and the second magnetoresistive effect element are one of a TMR element and a GMR element.

10. The magnetic sensor according to claim 1, further comprising a substrate, wherein the first magnetoresistive effect element and the second magnetoresistive effect element are placed at respective different positions on the substrate.

11. A magnetic encoder, comprising:
a magnetic sensor; and
a scale part that comprises an absolute signal track where absolute magnetic signals are recorded, and an incremental signal track where incremental magnetic signals are recorded, and that is relatively movable relative to the magnetic sensor, wherein
the magnetic sensor comprises at least a first magnetoresistive effect element and a second magnetoresistive effect element that can detect an external magnetic field,
each of the first magnetoresistive effect element and the second magnetoresistive effect element includes at least a magnetic layer having a magnetization direction that varies according to the external magnetic field,
the first magnetoresistive effect element has a first response characteristic,
the second magnetoresistive effect element has a second response characteristic,
the first response characteristic is a characteristic relative to a change of an output from the first magnetoresistive effect element with the change of the external magnetic field,
the second response characteristic is a characteristic relative to a change of an output from the second magnetoresistive effect element with the change of the external magnetic field,
the first response characteristic and the second response characteristic are different from each other; and
the magnetic sensor and the scale part are placed to face each other so that the first magnetoresistive effect element and the absolute signal track face each other and so that the second magnetoresistive effect element and the incremental signal track face each other.

12. A magnetic sensor, comprising at least a first magnetic sensing element and a second magnetic sensing element that can detect an external magnetic field, wherein
when the first magnetic sensing element and the second magnetic sensing element are viewed from an upper side of the first magnetic sensing element and the second magnetic sensing element, both have shapes that are different from each other;
the first magnetic sensing element has a first response characteristic;

the second magnetic sensing element has a second response characteristic;

the first response characteristic is a characteristic relative to a change of an output from the first magnetic sensing element with the change of the external magnetic field;

the second response characteristic is a characteristic relative to a change of an output from the second magnetic sensing element with the change of the external magnetic field; and the first response characteristic and the second response characteristic are different from each other.

13. The magnetic sensor according to claim 12, further comprising a substrate, wherein
the first magnetic sensing element and the second magnetic sensing element are placed at respective different positions on the substrate.

14. The magnetic sensor according to claim 12, wherein
the shape of the first magnetic sensing element viewed from the upper side is a shape that increase the slope of the output from the first magnetic sensing element with the change of the external magnetic field; and
the shape of the second magnetic sensing element viewed from the upper side is a shape that decrease the slope of the output from the second magnetic sensing element with the change of the external magnetic field compared to the slope of the output from the first magnetic sensing element.

15. The magnetic sensor according to claim 12, wherein
the shape of the first magnetic sensing element viewed from the upper side is a shape that more steeply changes the output from the first magnetic sensing element with the change of the external magnetic field; and
the shape of the second magnetic sensing element viewed from the upper side is a shape that less steeply changes the output from the first magnetic sensing element with the change of the external magnetic field.

16. The magnetic sensor according to claim 12, wherein
the shape of the first magnetic sensing element is a polygon with M+N sides (M is 3 or greater integer, and N is 1 or greater integer); and
the shape of the second magnetic sensing element is a polygon with M sides.

17. The magnetic sensor according to claim 12, wherein
the shape of the first magnetic sensing element is a polygon with M+N sides (M is 4 or greater integer, and N is 1 or greater integer); and
the shape of the second magnetic sensing element is a polygon with M sides.

18. The magnetic sensor according to claim 12, wherein
the shape of the second magnetic sensing element is a shape having at least two facing sides in parallel with each other.

19. The magnetic sensor according to claim 12, wherein
the shape of the first magnetic sensing element nearly circular, and
the shape of the second magnetic sensing element is nearly square-shaped.

* * * * *